United States Patent
Suzuki et al.

(10) Patent No.: US 10,077,385 B2
(45) Date of Patent: Sep. 18, 2018

(54) RESIN COMPOSITION AND ELECTRONIC COMPONENT

(71) Applicant: Fuji Electric Co., Ltd., Kanagawa (JP)

(72) Inventors: Kotomi Suzuki, Kawasaki (JP); Yuji Ichimura, Kawasaki (JP); Yuko Nakamata, Kawasaki (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 15/411,687

(22) Filed: Jan. 20, 2017

(65) Prior Publication Data
US 2017/0233620 A1    Aug. 17, 2017

(30) Foreign Application Priority Data

Feb. 12, 2016 (JP) ................. 2016-024690
May 18, 2016 (JP) ................. 2016-099699
Sep. 15, 2016 (JP) ................. 2016-180591

(51) Int. Cl.
| | | |
|---|---|---|
| C08L 63/00 | (2006.01) | |
| C09J 163/00 | (2006.01) | |
| C08L 79/08 | (2006.01) | |
| C09J 179/08 | (2006.01) | |
| C08L 79/04 | (2006.01) | |
| C09J 179/04 | (2006.01) | |
| C09J 11/04 | (2006.01) | |
| H01L 23/29 | (2006.01) | |
| H01L 23/00 | (2006.01) | |

(52) U.S. Cl.
CPC ............ *C09J 163/00* (2013.01); *C08L 63/00* (2013.01); *C08L 79/04* (2013.01); *C08L 79/08* (2013.01); *C09J 11/04* (2013.01); *C09J 179/04* (2013.01); *C09J 179/08* (2013.01); *H01L 23/295* (2013.01); *H01L 24/33* (2013.01); *H01L 2224/3224* (2013.01); *H01L 2924/186* (2013.01)

(58) Field of Classification Search
CPC ................................ C08L 63/00; C09J 163/00
See application file for complete search history.

(56) References Cited

U.S. PATENT DOCUMENTS

| | | | | |
|---|---|---|---|---|
| 2003/0114622 | A1* | 6/2003 | Masawaki | C08J 3/26 526/318 |
| 2004/0075802 | A1* | 4/2004 | Kitamura | C08G 59/621 349/153 |
| 2010/0183862 | A1* | 7/2010 | Yokoe | C08G 59/504 428/300.1 |
| 2015/0235871 | A1* | 8/2015 | Akiba | H01L 21/67126 438/113 |
| 2015/0322242 | A1* | 11/2015 | Hirose | C08J 5/005 523/210 |
| 2015/0366054 | A1* | 12/2015 | Okasaka | B32B 15/08 361/783 |
| 2017/0282527 | A1* | 10/2017 | Akiba | H01L 21/67126 |

FOREIGN PATENT DOCUMENTS

EP    1265463    * 12/2002

* cited by examiner

*Primary Examiner* — Sonya D McCall Shepard
(74) *Attorney, Agent, or Firm* — Lerner, David, Littenberg, Krumholz & Mentlik, LLP

(57) ABSTRACT

A resin composition has a high glass transition temperature and is highly adhesive to a member made of metal, ceramics, or the like. The resin composition includes a thermosetting base resin, a thermoplastic resin powder, a curing agent, and an inorganic filler, a cured resin product formed by curing the resin composition, and an electrical member.

13 Claims, 1 Drawing Sheet

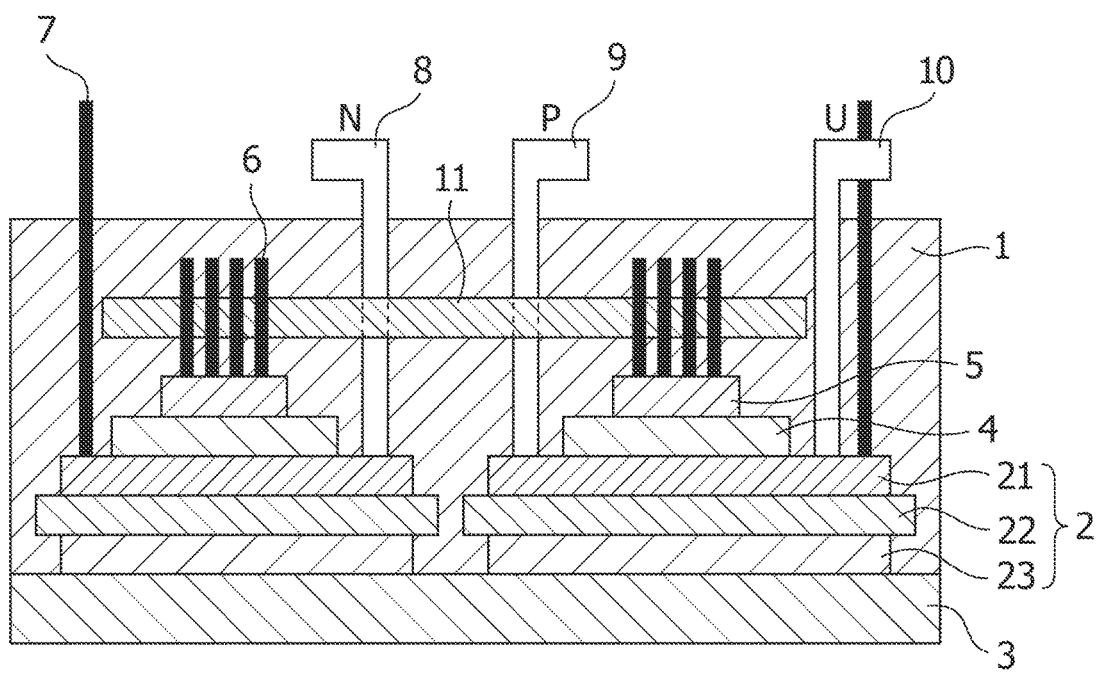

RESIN COMPOSITION AND ELECTRONIC COMPONENT

CROSS-REFERENCE TO RELATED APPLICATIONS

This Application claims priority from Japanese Patent Application No. 2016-024690 filed Feb. 12, 2016, Japanese Patent Application No. 2016-099699 filed May 18, 2016 and Japanese Patent Application No. 2016-180591 filed Sep. 15, 2016, which are incorporated herein by reference in their entirety.

FIELD OF THE INVENTION

The present invention relates to a resin composition used in an electronic component.

BACKGROUND

Thermosetting resin compositions, such as an epoxy resin containing an inorganic filler, are widely used in semiconductor packages as a sealant for protecting a semiconductor element (chip) from the environment. The sealant seals multiple members with different coefficients of linear expansion, such as a chip, Cu, PPS (polyphenylene sulfide), and an insulating substrate. An inorganic filler added to the thermosetting resin decreases the coefficient of thermal expansion of the thermosetting resin, suppresses the warping of a cured resin product, and prevents interface peeling, cracks, and the like in a semiconductor package, from occurring.

SUMMARY OF THE INVENTION

Problems to be Solved by the Invention

There may be cases, however, in which very minute peeling occurs at the interface between the sealant and the above-described multiple members in a semiconductor device which uses the sealant made of a conventional thermosetting resin composition, causing a problem of deterioration of power cycling capability. Moreover, demand for resistance to high temperatures has increased because next generation power semiconductors have been put into practical use, leading to rising demands for enhancement of heat resistance of a resin for sealing the chip. In order to enhance these characteristics, a resin with excellent mechanical strength and heat resistance is required.

Means for Solving the Problems

As a result of intensive research, the present inventors have conceived of adding a thermoplastic resin powder such as powdered polyetherimide to a resin composition including at least a thermosetting resin and an inorganic filler To be more specific, an embodiment of the present invention is a resin composition including a thermosetting base resin, a thermoplastic resin powder, a curing agent, and the inorganic filler.

In the resin composition, it is preferable that the thermoplastic resin powder be at least one selected from powdered polyetherimide, powdered polybenzimidazole, powdered thermoplastic polyimide, powdered polyethersulfone, powdered polysulfone, powdered polyamide 46, and powdered polyamide-imide.

It is preferable that the resin composition include 10 to 50 parts by mass of the thermoplastic resin powder relative to 100 parts by mass of the thermosetting base resin.

In the resin composition, it is preferable that the thermoplastic resin powder be powdered polyamide-imide, and the resin composition include 5 to 50 parts by mass of the powdered polyamide-imide relative to 100 parts by mass of the thermosetting base resin.

In the resin composition, it is preferable that the curing agent include an acid anhydride-based curing agent.

In the resin composition, it is preferable that the inorganic filler include at least one selected from fused silica, silica, alumina, aluminum hydroxide, talc, clay, mica, and glass fiber.

It is preferable that the resin composition further include a curing accelerator, and the curing accelerator include imidazole or a derivative thereof.

It is preferable that the resin composition be used for sealing an electronic component.

According to another embodiment, the present invention is a cured resin product formed by curing the resin composition according to any of the descriptions above.

According to still another embodiment, the present invention is an electronic component including: a cured resin product being formed by curing the resin composition according to any of the descriptions above and being used in at least part of the electronic component.

According to yet another embodiment, the present invention is a semiconductor device fabricated by sealing a member including a semiconductor element and a metal member mounted on a substrate, using an sealant containing the resin composition according to any of the descriptions above.

Advantageous Effects of the Invention

Aspect of the present invention make it possible to obtain a cured resin product with excellent mechanical strength and heat resistance. In addition, adhesion and moisture resistance are also enhanced with the enhancement of the mechanical strength. Moreover, it is possible to enhance the heat resistance, the moisture resistance, and the mechanical strength of a sealant by using this resin composition as the sealant for an electronic component, and thereby to enhance the reliability of the electronic component. In particular, an embodiment of the present invention is suitable for the sealant of a semiconductor device, and is suitably applicable to electronic or power equipment of an automobile, a vehicle, an aircraft, a marine vessel, a vending machine, an air conditioner, a power generator, and the like, which are used outdoors where environmental management is difficult.

BRIEF DESCRIPTION OF THE DRAWINGS

FIG. is a conceptual diagram illustrating a cross-sectional structure of a semiconductor device, which is an example of an electronic component which uses a resin composition according to the present invention as a sealant.

DETAILED DESCRIPTION

Hereinbelow, embodiments of the present invention are described with reference to the drawing. Note that the present invention is not limited to the embodiments to be described below.

First Embodiment: Resin Composition

According to the first embodiment, the present invention is a resin composition containing a thermosetting base resin, a thermoplastic resin powder, a curing agent, and an inorganic filler. Hereinafter, these constituent requirements are described more specifically.

The thermosetting base resin used in the embodiment is not particularly limited, but includes, for example, an epoxy resin, a phenolic resin, a maleimide resin, and the like. For the electronic component, an epoxy resin having at least two epoxy groups in one molecule is particularly preferable because of its high dimensional stability, water resistance, chemical resistance, and electrical insulation property. Specifically, examples of such epoxy resin include, but are not limited to, a bisphenol A epoxy resin, a bisphenol F epoxy resin, a bisphenol E epoxy resin, a bisphenol S epoxy resin, a bisphenol AD epoxy resin, a naphthalene type epoxy resin, a phenol novolac type epoxy resin, a cresol novolac type epoxy resin, an alicyclic epoxy resin, a maleimide naphtol resin, a maleimide triazine resin, a maleimide resin, a glycidyl ether type epoxy resin, a glycidyl ester type epoxy resin, a glycidyl amine type epoxy resin, and like. These thermosetting base resins may be used alone or in combination of two or more. It is possible to adjust as appropriate physical properties such as the heat resistance, toughness, and flame retardancy depending on the combination of monomer molecules to be copolymerized.

A reactive diluent having a cross-linkable functional group such as an epoxy group at a terminal may be mixed as appropriate with the resin composition as an optional component in order to adjust viscosity and cross-linking density. Examples of the reactive diluent include, but are not limited to, phenyl glycidyl ether, 2-ethylhexyl glycidyl ether, n-butyl glycidyl ether, cresyl glycidyl ether, p-s-butylphenyl glycidyl ether, allyl glycidyl ether, α-pinene oxide, styrene oxide, glycidyl methacrylate, and 1-vinyl-3,4-epoxycyclohexane. The amount of the reactive diluent added may be determined as appropriate by one skilled in the art depending on the properties and the like of the thermosetting base resin.

The curing agent used in the embodiment is not particularly limited, as long as the curing agent is capable of reacting with the thermosetting base resin and curing. It is preferable to use an acid anhydride-based curing agent. The acid anhydride-based curing agent includes, for example, an aromatic acid anhydride, or specifically, a phthalic anhydride, a pyromellitic anhydride, a trimellitic anhydride, and the like. Alternatively, the acid anhydride-based curing agent includes a cycloaliphatic acid anhydride, or specifically tetrahydrophthalic anhydride, methyltetrahydrophthalic anhydride, hexahydrophthalic anhydride, methylhexahydrophthalic anhydride, methyl nadic anhydride, and the like, and, an aliphatic acid anhydride, or specifically succinic anhydride, poly(adipic anhydride), poly(sebacic anhydride), poly(azelaic anhydride), and the like. The amount of curing agent blended is preferably 50 to 170 parts by mass, and more preferably 80 to 150 parts by mass relative to 100 parts by mass of the thermosetting base resin. If the amount of curing agent blended is less than 50 parts by mass, the glass transition temperature (Tg) may decrease due to the shortage of cross-links, and if the amount of curing agent blended is greater than 170 parts by mass, the moisture resistance, the intense-heat deformation temperature, and the heat resistance stability may deteriorate.

A curing accelerator may be added to the resin composition as an optional component. As the curing accelerator, imidazole or a derivative thereof, tertiary amine, boric acid ester, a Lewis acid, an organometallic compound, an organic acid metal salt, and the like may be blended as appropriate. When an imidazole-based curing accelerator is used, the amount thereof added is preferably 0.01 to 50 parts by mass, and more preferably 0.1 to 20 parts by mass relative to 100 parts by mass of the thermosetting base resin.

The thermoplastic resin powder is in a powdered state and does not have fluidity at normal temperature and pressure.

Preferably, the thermoplastic resin powder has a melting point (Tm) or a glass transition temperature higher than the curing temperature of the thermosetting base resin, and is specifically at least one selected from powdered polyetherimide, powdered polybenzimidazole, powdered thermoplastic polyimide, powdered polyethersulfone, powdered polysulfone, powdered polyamide 46, powdered semi-aromatic polyamide, and powdered polyamide-imide. Thus, one, or a combination of two or more, of these may be used. Here, the semi-aromatic polyamide is a polyamide where an aromatic unit is introduced in a part of the molecular skeleton of aliphatic polyamide such as polyamide 46, and includes, but is not limited to, polyphthalic amide (PPA), PA6T, PA9T, and the like.

The shape of the thermoplastic resin powder is not particularly limited and may be sphere-shaped, needle-shaped, foil-shaped, fiber-shaped, or the like. In particular, a spherical particle is preferable. In addition, the average particle diameter is preferably approximately 10 to 100 μm, and more preferably approximately 20 to 50 μm, but is not limited to these ranges because, when the average particle diameter is within this range, it is possible to ensure favorable dispersibility. In the present specification, the average particle diameter refers to a value measured by a laser diffraction method.

The thermoplastic resin powder is preferably added so as to be 1 to 50 parts by mass, and is more preferably added so as to be 1 to 30 parts by mass relative to 100 parts by mass of the thermosetting base resin.

The powdered polyetherimide is a polyetherimide in a powdered state at normal temperature and pressure. The polyetherimide used in the embodiment is not particularly limited, and is a polymer containing an aliphatic-, alicyclic-, or aromatic-based ether unit and a cyclic imide as repeating units. Out of these, the condensate of 2,2-bis[4-(2,3-dicarboxyphenoxy)phenyl]propane dianhydride and m-phenylenediamine or p-phenylenediamine is preferably used. The powdered polyetherimide may be mixed with other components as long as it contains polyetherimide as the main component and is in the form of powder at normal temperature. The bending strength and the elongation of polyetherimide are 164 MPa and 60%, respectively. The bending strength and the elongation of (bisphenol A) epoxy resin are 73 MPa and 2%, respectively. In other words, polyetherimide has a mechanical strength higher than that of the epoxy resin. Moreover, polyetherimide is preferably used in particular because it can contribute to the enhancement of adhesion, in addition to mechanical strength and heat resistance, of the cured resin product. The bending strength and the elongation each are a characteristic indicative of mechanical strength. The bending strength and the elongation are measured respectively using ISO178 (JIS K7171) and ISO527-1 (JIS K7161), which are the testing standards for physical property evaluation of plastics.

Powdered polybenzimidazole may be mixed with other components as long as it contains polybenzimidazole as the main component and is in the form of powder at normal temperature. Polybenzimidazole has a bending strength of 220 MPa and an elongation of 10%, and thus has a high mechanical property. Polybenzimidazole has a high glass transition temperature in particular, and the bulk strength thereof such as tensile strength and bending strength is high. Thus, polybenzimidazole can impart a high mechanical strength and a heat resistance as well as a moisture resistance to the cured resin product.

The bending strength and the elongation of thermoplastic polyimide are 137 MPa and 90%, respectively. The bending strength and the elongation of polyethersulfone are 129 MPa and 80%, respectively. The bending strength and the elongation of polysulfone are 106 MPa and 75%, respectively. The bending strength and the elongation of polyamide 46 are 120 MPa and 45%, respectively. Each of these has a mechanical strength higher than that of the epoxy resin, and hence is advantageous in terms of characteristics such as moisture resistance and adhesion, as in the cases of polyetherimide and polybenzimidazole.

The bending strength and the elongation of powdered polyamide-imide are 235 MPa and 15%, respectively. In addition, as in the case of powdered polybenzimidazole, powdered polyamide-imide has a high glass transition temperature, and the bulk strength thereof such as tensile strength and bending strength is high. Thus, it is possible to impart a high mechanical strength and a heat resistance as well as a moisture resistance to the cured resin product. Moreover, because of the glass transition temperature and the strength characteristic, powdered polyamide-imide is advantageous in that it can sufficiently impart these effects even when the addition amount is small.

Examples of the inorganic filler used in the embodiment include, but are not limited to, fused silica, silica, alumina, aluminum hydroxide, titania, zirconia, aluminum nitride, talc, clay, mica, glass fiber, and the like. These inorganic fillers make it possible to enhance the thermal conductivity of the cured product and to reduce the coefficient of thermal expansion of the cured product. These inorganic fillers may be used alone or in mixture of two or more. In addition, these inorganic fillers may be a microfiller or may be a nanofiller, or alternatively two or more inorganic fillers having different particle diameters or of different kinds may be used in mixture. In particular, it is preferable to use an inorganic filler with an average particle diameter of approximately 0.2 to 20 μm. The amount of inorganic filler added is preferably 100 to 600 parts by mass and more preferably 200 to 400 parts by mass when the total mass of the thermosetting base resin and the curing agent is set to 100 parts by mass. If the amount of inorganic filler blended is less than 100 parts by mass, the possibility of peeling and cracks may increase in some cases due to the increase in the coefficient of thermal expansion of the sealant. If the amount blended is greater than 600 parts by mass, the viscosity of the composition may increase, leading to the deterioration of extrusion moldability.

In the case in which the resin composition of the present invention is used as a resin for a sealant of a semiconductor device, the resin composition may contain any optional additive as long as the characteristics thereof are not deteriorated. Examples of the additive include, but are not limited to, a flame retardant, a pigment for coloring a resin, a plasticizer for enhancing crack resistance, and a silicone elastomer. These optional components and the addition amount thereof may be determined as appropriate by those skilled in the art depending on the specifications of the semiconductor device.

The method of preparing the resin composition according to the embodiment makes it possible to prepare the resin composition by mixing together the components described above in an ordinary method, and dispersing the thermoplastic resin powder in the thermosetting resin preferably in a substantially uniform manner.

The resin composition according to the first embodiment of the present invention can provide a cured resin product having excellent mechanical strength and heat resistance. In addition, moisture resistance and adhesion are also excellent with the enhancement of the mechanical strength. Hence, the resin composition can be used favorably for sealing an electronic component, in particular for sealing a semiconductor.

Second Embodiment: Cured Resin Product

According to another aspect, the present invention relates to a cured resin product formed by curing the resin composition described above. The method of preparing the cured resin product includes the steps of: preparing a resin composition by mixing the components described in terms of the resin composition in an ordinary method and dispersing the components; and heat-curing the resin composition, while optionally bringing the resin composition into contact with an object to be sealed. At the step of heat-curing, the heating temperature is preferably equal to or above the curing temperature of the thermosetting resin and below the melting point of the thermoplastic base resin. Curing in two steps at a temperature suitable for the curing characteristic of the thermosetting resin is more preferable. In a particularly preferable mode in which the thermosetting base resin is an epoxy resin, it is possible to cure the epoxy resin by retaining the epoxy resin for approximately thirty minutes to one hour at any temperature in the range from 80° C. to 150° C., and after that retaining the epoxy resin for approximately one to ten hours at any temperature in the range from approximately 100° C. to 200° C., for example.

In the cured resin product prepared by the method described above, the thermoplastic resin powder is dispersed in the thermosetting resin preferably in a substantially uniform manner. Thus, the mechanical strength, the heat resistance, the moisture resistance, and the adhesion of the cured product are enhanced.

Third Embodiment: Electronic Component

According to a third embodiment, the present invention relates to an electronic component including the aforementioned cured resin product as one of the constituents. Examples of the electronic component include electronic or power equipment of an automobile, a vehicle, an aircraft, a marine vessel, a vending machine, an air conditioner, a power generator, and the like, which are used outdoors where environmental management is difficult. Specifically, examples of the equipment include a semiconductor module, a mold transformer, a gas-insulated switchgear, and the like, but are not particularly limited. The electronic component is typically a semiconductor device sealed using a sealant containing the resin composition according to the first embodiment. Hereinafter, description is provided for the semiconductor device of the embodiment. However, the electronic component according to the present invention is not limited to the semiconductor device. The same applies to an electronic component which has an interface between different materials such as a resin and a metal or a ceramic, and may suffer from problems of mechanical strength and heat resistance of the resin and peeling at the interface.

FIG. 1 illustrates a conceptual cross-sectional diagram of the semiconductor device according to the embodiment. The semiconductor device may be a power module or the like used for causing a large current to flow, but is not particularly limited. In the semiconductor module, a laminated substrate 2 includes a first conductive plate 23 on a lower surface of an insulating substrate 22 being one surface, and a second conductive plate 21 on an upper surface thereof being another surface. A heat spreader 3 is attached to a lower surface of the laminated substrate 2 being a surface on the first conductive plate 23 side using a bonding layer such as solder. Multiple SiC semiconductor elements 4 are mounted and attached to an upper surface of the laminated substrate 2 being a surface on the second conductive plate 21 side using a conductive bonding layer (not shown). Each of the SiC semiconductor elements 4 may be an RC-IGBT element or the like, but it is not limited to a specific element. An implant-type printed circuit board 11 provided with implant pins 6 on the bonding layer 5 is attached to upper surfaces of the semiconductor elements 4. Control terminals 7 are attached to upper surfaces of the second conductive plates 21, and is configured to enable electrical connection to the outside of the semiconductor module. One end portion of each of main terminals N8, P9, and U10 is attached to the upper surface of the corresponding second conductive plate 21, and another end portion thereof is exposed to an outer side of the semiconductor module. In addition, these members are sealed by a sealant 1 including the resin composition according to the first embodiment, and constitute the semiconductor module. In the present specification, the upper surface and the lower surface are relative terms indicating up and down in the FIGURE for the purpose of explanation, and do not limit up and down in relation to, for example, how the semiconductor module is used.

The method of manufacturing such a semiconductor module includes bonding the laminated substrates 2 to the heat spreader 3 using solder or the like in accordance with the conventional technique, and further mounting the semiconductor elements 4 on the laminated substrates 2. Subsequently, the implant pins 6, the control terminals 7, the implant-type printed circuit board 11, and the main terminals N8, P9, and U10 can be attached. Thereafter, these members can be sealed using the sealant 1 by a method such as potting or transfer molding, followed by heat-curing. Thus, the semiconductor module can be manufactured.

In the embodiment illustrated in the FIGURE, the entire semiconductor module is sealed by the sealant including the resin composition according to the first embodiment of the present invention. However, the aspect of sealing is not limited to that illustrated in the FIGURE. For example, the configuration may be such that only a peripheral portion of the laminated substrate or a peripheral portion of the semiconductor element is sealed by the resin composition according to the present invention, and other portions are sealed by another kind of sealing resin according to a conventional technique, which does not contain the thermoplastic resin powder.

Another aspect provides a semiconductor module provided with a different configuration, although not illustrated. Specifically, the module may have a casing, which includes a built-in external terminal, attached on a heat spreader. A laminated substrate, which includes an insulating substrate sandwiched by two upper and lower conductive plates, may be bonded to the heat spreader. In addition, a semiconductor element mounted on the laminated substrate, a conductive plate on the upper side of the laminated substrate, and an external terminal can be connected to one another via aluminum wires (wire bonding). The inside of the casing of the module can be filled with a sealant. As in the case of the above, the aspect of sealing using the sealant may be such that the entirety is sealed by the resin composition according to the present invention, or such that only a peripheral portion of the laminated substrate or a peripheral portion of the semiconductor element is sealed by the resin composition according to the present invention, and other portions are sealed by another kind of sealing resin according to the conventional technique, which may not contain the thermoplastic resin powder. Alternatively, instead of wire bonding, conductive connection between the semiconductor element and the terminal or the like may be ensured using a lead frame. Such a configuration is preferably adopted in a semiconductor module including a Si power semiconductor element, in particular.

EXAMPLES

Hereinafter, aspects of the present invention are described in further detail using Examples of the present invention. However, that the present invention is not limited to the scope of Examples below.

Example 1-1

Used as the thermosetting base resin was a mixture of a bisphenol A epoxy resin (manufactured by Nippon Steel & Sumitomo Metal Corporation, trade name "YD-825GS") and an amino-glycidyl ether type epoxy resin (Japan Epoxy Resin Co. Ltd., trade name EP-630) with equal masses. Then, 30 parts by mass of powdered polyetherimide relative to 100 parts by mass of the thermosetting base resin were mixed with the thermosetting resin. Note that the polyetherimide used here was one manufactured by SABIC Innovative plastics Japan LLC with the trade name "ULTEM." This polyetherimide has a glass transition point of 217° C., and was used in the form of powder with an average particle diameter of 45 μm. In addition, 120 parts by mass of an acid anhydride relative to 100 parts by mass of the thermosetting base resin were used as the curing agent. Furthermore, fused silica particles (manufactured by Tatsumori Ltd., trade name "ZA-30") with an average particle diameter of 5 μm were used as the inorganic filler. The preparation was made such that the addition amount was 230 parts by mass when the total mass of the thermosetting base resin and the curing agent was set to 100 parts by mass. An uncured resin composition was obtained by mixing these. The resin composition thus obtained was heated and cured for one hour at 100° C., and for one hour at 200° C., to obtain a cured resin product.

Example 1-2

A resin composition and a cured resin product of Example 1-2 were obtained in the same manner as in Example 1-1, except that the composition of the powdered polyetherimide was set to 10 parts by mass relative to 100 parts by mass of the thermosetting base resin in Example 1-1.

Example 1-3

A resin composition and a cured resin product of Example 1-3 were obtained in the same manner as in Example 1-1, except that the composition of the powdered polyetherimide was set to 50 parts by mass in Example 1-1.

Comparative Example 1

In Example 1-1, the powdered polyetherimide was not blended. A resin composition and a cured resin product of Comparative Example 1 were obtained with the other compositions and the heat-curing conditions the same as those in Example 1-1.

Example 2-1

Used as the thermosetting base resin was a mixture of a bisphenol A epoxy resin (manufactured by Nippon Steel & Sumitomo Metal Corporation, trade name "YD-825GS") and an amino-glycidyl ether type epoxy resin (Japan Epoxy Resin Co. Ltd., trade name EP-630) with equal masses. Then, 30 parts by mass of powdered polybenzimidazole relative to 100 parts by mass of the thermosetting base resin were mixed with the thermosetting base resin. Note that the powdered polybenzimidazole used here was one manufactured by AZ Electronic Materials plc with the trade name "polybenzimidazole," and having a glass transition temperature of 427° C. and an average particle diameter of 50 μm. In addition, 120 parts by mass of an acid anhydride relative to 100 parts by mass of the thermosetting base resin were used as the curing agent. Furthermore, fused silica particles (manufactured by Tatsumori Ltd., trade name "ZA-30") with an average particle diameter of 5 μm were used as the inorganic filler. The preparation was made such that the addition amount was 230 parts by mass when the total mass of the thermosetting base resin and the curing agent was set to 100 parts by mass. An uncured resin composition was obtained by mixing these. The resin composition thus obtained was heated and cured for one hour at 100° C., and for ten hours at 200° C., to obtain a cured resin product.

Example 2-2

A resin composition and a cured resin product of Example 2-2 were obtained in the same manner as in Example 2-1, except that the composition of the powdered polybenzimidazole was set to 10 parts by mass relative to 100 parts by mass of the thermosetting base resin in Example 2-1.

Example 2-3

A resin composition and a cured resin product of Example 2-3 were obtained in the same manner as in Example 2-1, except that the composition of the powdered polybenzimidazole was set to 50 parts by mass relative to 100 parts by mass of the thermosetting base resin in Example 2-1.

Comparative Example 2

In Example 2-1, the powdered polybenzimidazole was not blended. A resin composition and a cured resin product of Comparative Example 2 were obtained with the other compositions and the heat-curing conditions the same as in Example 2-1.

Example 3-1

Used as the thermosetting base resin was a mixture of a bisphenol A epoxy resin (manufactured by Mitsubishi Chemical Corporation, trade name "bisphenol A") and an alicyclic epoxy resin (manufactured by Daicel Corporation, trade name "CELLOXIDE") with equal masses. Then, 30 parts by mass of powdered polyamide-imide relative to 100 parts by mass of the thermosetting base resin were mixed with the thermosetting base resin. The powdered polyamide-imide used here was one manufactured by Toray Industries, Inc. with the trade name "TPS," and having a glass transition temperature of 280° C. and an average particle diameter of 50 μm. In addition, 120 parts by mass of an acid anhydride relative to 100 parts by mass of the thermosetting base resin were used as the curing agent. Furthermore, fused silica particles (manufactured by Tatsumori Ltd., trade name "ZA-30") with an average particle diameter of 5 μm were used as the inorganic filler. The preparation was made such that the addition amount was 230 parts by mass when the total mass of the thermosetting base resin and the curing agent was set to 100 parts by mass. An uncured resin composition was obtained by mixing these. The resin composition thus obtained was heated and cured for one hour at 100° C., and for ten hours at 200° C. to obtain a cured resin product.

Example 3-2

A resin composition and a cured resin product of Example 3-2 were obtained in the same manner as in Example 3-1, except that the composition of the powdered polyamide-imide was set to 10 parts by mass relative to 100 parts by mass of the thermosetting base resin in Example 3-1.

Example 3-3

A resin composition and a cured resin product of Example 3-3 were obtained in the same manner as in Example 3-1, except that the composition of the powdered polyamide-imide was set to 5 parts by mass relative to 100 parts by mass of the thermosetting base resin in Example 3-1.

Example 3-4

A resin composition and a cured resin product of Example 3-4 were obtained in the same manner as in Example 3-1, except that the composition of the powdered polyamide-imide was set to 50 parts by mass relative to 100 parts by mass of the thermosetting base resin in Example 3-1.

Comparative Example 3

In Example 3-1, the powdered polyamide-imide was not blended. A resin composition and a cured resin product of Comparative Example 3 were obtained with the other compositions and the heat-curing conditions the same as in Example 3-1.

Glass Transition Temperature

The amount of change in length against the temperature of the resin was measured for the resin compositions of Examples and Comparative Examples by using a thermomechanical analysis (TMA) apparatus TMA/SS7100 manufactured by SII. The inflection points were defined as glass transition temperatures.

Moisture Resistance Test

Ten testing devices were fabricated in which the resin composition obtained in each of Examples and Comparative Examples was used as the sealing resin. The testing devices each include a lead frame, wires, a chip, a DCB (direct copper bonding) substrate, and a base. These test devices were subjected to a high temperature high humidity storage testing. After the devices were left at a temperature of 85° C. and a relative humidity of 85% for 100 hours, the electrical characteristics were evaluated to measure the resistance values. The evaluation was such that packages with increased resistance values after the high temperature high humidity storage test were defective products, and packages the resistance values which were not increased after the high temperature high humidity storage test were non-defective products, compared to the initial resistance values before the high temperature high humidity storage test. As a result, the moisture resistance was determined to be "poor" when nine or fewer of the ten products were non-defective, and the moisture resistance was determined to be "good" when the number of non-defective products was ten.

Bending Strength Test

A bending strength test was carried out to evaluate the mechanical strengths of the resin compositions. Test pieces of the bending strength test each having the shape and dimensions of 80 mm×4 mm×10 mm were cut out from the cured resin products obtained in Examples and Comparative Examples. The three-point bending strength was measured under the conditions of a 64-mm support span length and a 2-mm/min crosshead speed, using a universal material testing apparatus (AG-50kNX) manufactured by Shimadzu Corporation.

Heat Cycle Test

A heat cycle test was carried out to evaluate heat resistance and adhesion. One cycle is defined as exposing the testing devices sealed using the resin compositions to a temperature of −40° C. for thirty minutes, and to a temperature of 175° C. for thirty minutes, where the specifications were the same as those used in the moisture resistance test. The heat cycle capability was judged by the number of heat cycles until peeling occurred between the chip and the sealing resin of the testing device. The occurrence of peeling was checked visually and with use of an ultrasonic flaw detector.

Results for the resin compositions and the cured products of Examples 1-1 to 1-3 and Comparative Example 1 are shown in Table 1.

TABLE 1

| | Example 1-1 | Example 1-2 | Example 1-3 | Comparative Example 1 |
|---|---|---|---|---|
| Amount of powdered polyetherimide (parts by mass relative to 100 parts by mass of thermosetting base resin) | 30 | 10 | 50 | 0 |
| Silica (parts by mass relative to total mass of thermosetting base resin and curing agent set to 100 parts by mass) | 230 | 230 | 230 | 230 |
| Glass transition temperature (° C.) | 203 | 197 | 207 | 195 |
| Moisture resistance | good | good | good | poor |
| Bending strength (MPa) | 154.5 | 142.1 | 162.7 | 83.3 |
| Heat cycle capability | >1000 | >1000 | >1000 | 500 |

Results for the resin compositions and the cured products of Examples 2-1 to 2-3 and Comparative Example 2 are shown in Table 2.

TABLE 2

| | Example 2-1 | Example 2-2 | Example 2-3 | Comparative Example 2 |
|---|---|---|---|---|
| Amount of powdered polybenzimidazole (parts by mass relative to 100 parts by mass of thermosetting base resin) | 30 | 10 | 50 | 0 |
| Silica (parts by mass relative to total mass of thermosetting base resin and curing agent set to 100 parts by mass) | 230 | 230 | 230 | 230 |
| Glass transition temperature (° C.) | 262 | 201 | 291 | 195 |
| Moisture resistance | good | good | good | poor |
| Bending strength (MPa) | 159.7 | 144 | 170.5 | 83.3 |
| Heat cycle capability | >1000 | >1000 | >1000 | 500 |

Results for the resin compositions and the cured products of Examples 3-1 to 3-4 and Comparative Example 3 are shown in Table 3.

TABLE 3

| | Example 3-1 | Example 3-2 | Example 3-3 | Example 3-4 | Comparative Example 3 |
|---|---|---|---|---|---|
| Amount of powdered polyamide-imide (parts by mass relative to 100 parts by mass of thermosetting base resin) | 30 | 10 | 5 | 50 | 0 |
| Silica (parts by mass relative to total mass of thermosetting base resin and curing agent set to 100 parts by mass) | 230 | 230 | 230 | 230 | 230 |
| Glass transition temperature (° C.) | 245° C. | 200° C. | 198° C. | 257° C. | 195° C. |
| Moisture resistance | good | good | good | good | poor |
| Bending strength (MPa) | 165 | 150.5 | 140.3 | 180.7 | 85 |
| Heat cycle capability | >1000 | >1000 | >1000 | >1000 | 500 |

From the results shown in Tables 1, 2, and 3, it turns out that it is possible to obtain an effect of increasing the glass transition temperature of the resin compositions (or cured resin product) by adding a powdered thermoplastic resin. In particular, favorable workability is achieved by adding 10 to 50 parts by mass of any of the powdered polyetherimide and the powdered polybenzimidazole, or 5 to 50 parts by mass of the powdered polyamide-imide relative to 100 parts by mass of the thermosetting base resin. The cured product achieved a favorable heat resistance, adhesion, moisture resistance, and mechanical strength. It is possible to provide a highly reliable semiconductor device using these resin compositions. The workability indicates whether or not a resin can flow easily into the terminal casing in the fabrication of the package of the semiconductor device. If the resin has a high viscosity, it is difficult for the resin to flow into the terminal casing, leading to an increase in the amount of work. This unfavorably increases the man-hours for fabricating the package of the semiconductor device. Specifically, the workability is evaluated based on the viscosity of the resin. When 50 parts by mass of any of the powdered polyetherimide, the powdered polybenzimidazole, and the powdered polyamide-imide are added, the viscosity increases to some extent compared to the case of 30 parts by mass. Hence, the amount of the powdered polyetherimide or the powdered polybenzimidazole added is more preferably 10 to 30 parts by mass. Meanwhile, the amount of the powdered polyamide-imide added is more preferably 5 to 30 parts by mass.

From the results shown in Tables 1, 2, and 3, it turns out that the powdered thermoplastic resin, which has a mechanical strength higher than that of the epoxy resin, imparts the same effect to the epoxy resin even for different compounds. The resin compositions according to Examples have a microphase-separated structure in which the thermoplastic resin powder is uniformly dispersed as fine particles in the matrix of the thermosetting resin. Thus, the amount of thermoplastic resin powder mixed with the thermosetting resin can be increased. In addition, it is possible to impart heat resistance and mechanical strength to the cured resin product, which are properties originally possessed by a predetermined thermoplastic resin according to the present invention. Moreover, the resin compositions according to the Examples were cured at the curing temperature of the epoxy resin. This curing temperature is lower than the softening temperatures of the polyetherimide, the polybenzimidazole, and the polyamide-imide. For this reason, foaming of the resin was less likely to occur in the curing process, making it possible to prevent voids from being formed in the resin compositions. In addition, it is difficult to react any of the polyetherimide, the polybenzimidazole, and the polyamide-imide with an epoxy resin monomer to cause a polymerization.

While there is no intention of being bound by theory, in the Examples, it is assumed that the thermoplastic resin powder is dispersed in the epoxy resin being a matrix resin, which allows the epoxy resin and the thermoplastic resin powder to bond together, and the epoxy molecules are fixed to the thermoplastic resin powder as a result. Thus, the anchor effect is considered to have increased the mechanical strength of the resin. In addition, the dispersed thermoplastic resin powder is considered to prevent cracks from growing together with the contribution of the thermoplastic resin powder itself having a high mechanical strength. Moreover, adhesion and moisture resistance are considered to be enhanced because of the strong bonding network. Furthermore, since a polyetherimide molecule, a polybenzimidazole, and a polyamide-imide each have nitrogen at a terminal, these substances easily bond to a Cu member (oxide) or the inorganic filler containing $SiO_2$ via a reaction not involving dehydration. What is more, polyamide-imide is a member having plasticity originating from amide bonds, in addition to imide bonds capable of imparting an excellent mechanical strength. Thus, it is considered that the addition of the polyamide-imide to the sealing resin composition enhanced member followability and adhesion to the thermosetting base resin such as the epoxy resin, and thus, fewer voids were generated. As a result, the heat cycle capability is considered to have been enhanced even though the additional amount was small. Note that the above description is a mere discussion for the understanding of the present invention, and the present invention is not limited to the specific theory described above.

The results shown in the Examples demonstrate that the resin composition of the present invention makes it possible to obtain a cured product imparted with the mechanical strength of the thermoplastic resin and having excellent heat resistance, adhesion, and moisture resistance while maintaining the mechanical and thermal characteristics of the thermosetting resin.

Reference Symbols List 1 sealant (cured resin product)
2 laminated substrate
21 second conductive plate
22 insulating substrate
23 first conductive plate
3 heat spreader
4 semiconductor element
5 bonding layer
6 implant pin
7 control terminal
8 main terminal N
9 main terminal P
10 main terminal U
11 printed circuit board

The invention claimed is:

1. A resin composition comprising: a thermosetting base resin, a thermoplastic resin powder, a curing agent, and an inorganic filler,
   wherein the thermoplastic resin powder is at least one selected from powdered polyetherimide, powdered polybenzimidazole, powdered thermoplastic polyimide, powdered polyethersulfone, powdered polysulfone, powdered polyamide 46, powdered semi-aromatic polyamide, and powdered polyamide-imide, and
   wherein the composition comprises 10 to 30 parts by mass of the thermoplastic resin powder relative to 100 parts by mass of the thermosetting base resin.

2. The resin composition according to claim 1, wherein the curing agent includes an acid anhydride-based curing agent.

3. The resin composition according to claim 1, wherein the inorganic filler includes at least one selected from fused silica, silica, alumina, aluminum hydroxide, talc, clay, mica, and glass fiber.

4. The resin composition according to claim 1, further comprising a curing accelerator, wherein the curing accelerator includes imidazole or a derivative thereof.

5. The resin composition according to any of claims 1, 2, 3, and 4, used for sealing an electronic component.

6. The resin composition according to claim 1, wherein the thermoplastic resin powder has a bending strength greater than that of the thermosetting base resin and/or the thermoplastic resin powder has a softening temperature higher than a curing temperature of the thermosetting base resin.

7. The resin composition according to claim 6, wherein an average particle diameter of the thermoplastic resin powder is approximately 10 to 100 μm.

8. The resin composition according to claim 1, wherein an average particle diameter of the thermoplastic resin powder is approximately 10 to 100 μm.

9. A resin composition comprising: a thermosetting base resin, a thermoplastic resin powder, a curing agent, and an inorganic filler,
  wherein the thermoplastic resin powder consists one selected from powdered polyetherimide, powdered polybenzimidazole, powdered thermoplastic polyimide, powdered polyethersulfone, powdered polysulfone, powdered polyamide 46, powdered semi-aromatic polyamide, and powdered polyamide-imide.

10. A resin composition comprising: a thermosetting base resin, a thermoplastic resin powder, a curing agent, and an inorganic filler,
  wherein the thermoplastic resin powder is at least one selected from powdered polyetherimide, powdered polybenzimidazole, powdered thermoplastic polyimide, powdered polyethersulfone, powdered polysulfone, powdered polyamide 46, powdered semi-aromatic polyamide, and powdered polyamide-imide, and
  wherein the amount of inorganic filler is 200 to 400 parts by mass when the total mass of thermosetting base resin and the curing agent is set to 100 parts by mass.

11. A cured resin product formed by curing the resin composition according to any of claims 1, 2, 3, 4, 9, and 10.

12. An electronic component comprising a cured resin product being formed by curing the resin composition according to any of claims 1, 2, 3, 4, 9, and 10 and being used in at least part of the electronic component.

13. A semiconductor device fabricated by sealing a member including a semiconductor element and a metal member mounted on a substrate, using a sealant containing a resin composition according to any of claims 1, 2, 3, 4, 9, and 10.

* * * * *